US012063012B2

(12) United States Patent
Machida

(10) Patent No.: US 12,063,012 B2
(45) Date of Patent: Aug. 13, 2024

(54) AMPLIFIER DEVICE, AUDIO DEVICE, AND METHOD FOR CONTROLLING AMPLIFIER DEVICE

(71) Applicant: MORIYAMA MEIBOKU CO., LTD., Fukuoka (JP)

(72) Inventor: Kazuaki Machida, Dazaifu (JP)

(73) Assignee: MORIYAMA MEIBOKU CO, LTD., Fukuoka (JP)

( * ) Notice: Subject to any disclaimer, the term of this patent is extended or adjusted under 35 U.S.C. 154(b) by 0 days.

(21) Appl. No.: 18/287,842

(22) PCT Filed: Apr. 12, 2022

(86) PCT No.: PCT/JP2022/017555
§ 371 (c)(1),
(2) Date: Oct. 20, 2023

(87) PCT Pub. No.: WO2022/224867
PCT Pub. Date: Oct. 27, 2022

(65) Prior Publication Data
US 2024/0186959 A1    Jun. 6, 2024

(30) Foreign Application Priority Data
Apr. 22, 2021    (JP) .................. 2021-072785

(51) Int. Cl.
*H03F 1/30*    (2006.01)
*H03F 1/26*    (2006.01)
(Continued)

(52) U.S. Cl.
CPC ............... *H03F 1/26* (2013.01); *H04R 3/00* (2013.01); *H04R 9/025* (2013.01); *H03F 2200/03* (2013.01); *H03F 2200/541* (2013.01)

(58) Field of Classification Search
CPC ................. H03F 1/30; H03F 1/28; H03F 3/22
(Continued)

(56) References Cited

U.S. PATENT DOCUMENTS

| 5,612,646 A * | 3/1997 | Berning .................. H03F 3/181 330/297 |
| 7,791,353 B2 * | 9/2010 | Bellan .................... G01R 31/52 324/529 |
| 2014/0260922 A1 * | 9/2014 | Jennings ................ G10H 3/143 84/731 |

FOREIGN PATENT DOCUMENTS

| JP | 49-72146 U1 | 6/1974 |
| JP | 10-224884 A | 8/1998 |
| JP | 2003-163548 A | 6/2003 |

* cited by examiner

*Primary Examiner* — Henry Choe
(74) *Attorney, Agent, or Firm* — Heedong Chae; Lucem, PC

(57) ABSTRACT

An amplifier device includes a back-EMF voltage shorting circuit between a power supply terminal located on a primary side of an output transformer and a constant potential terminal grounded. The back-EMF voltage shorting circuit is provided with a capacitor and a diode in parallel. When a back-EMF voltage input into a circuit of an amplifier device is a positive potential, a back-EMF current flows from the power supply terminal toward the constant potential terminal, and the back-EMF current is short-circuited by the capacitor at this time. On the other hand, when the input back-EMF voltage is a negative potential, the back-EMF current flows from the constant potential terminal toward the power supply terminal, and is short-circuited by the diode at this time.

6 Claims, 22 Drawing Sheets

(51) Int. Cl.
*H04R 3/00* (2006.01)
*H04R 9/02* (2006.01)

(58) Field of Classification Search
USPC .......................................... 330/297, 44, 165
See application file for complete search history.

[FIG. 1]
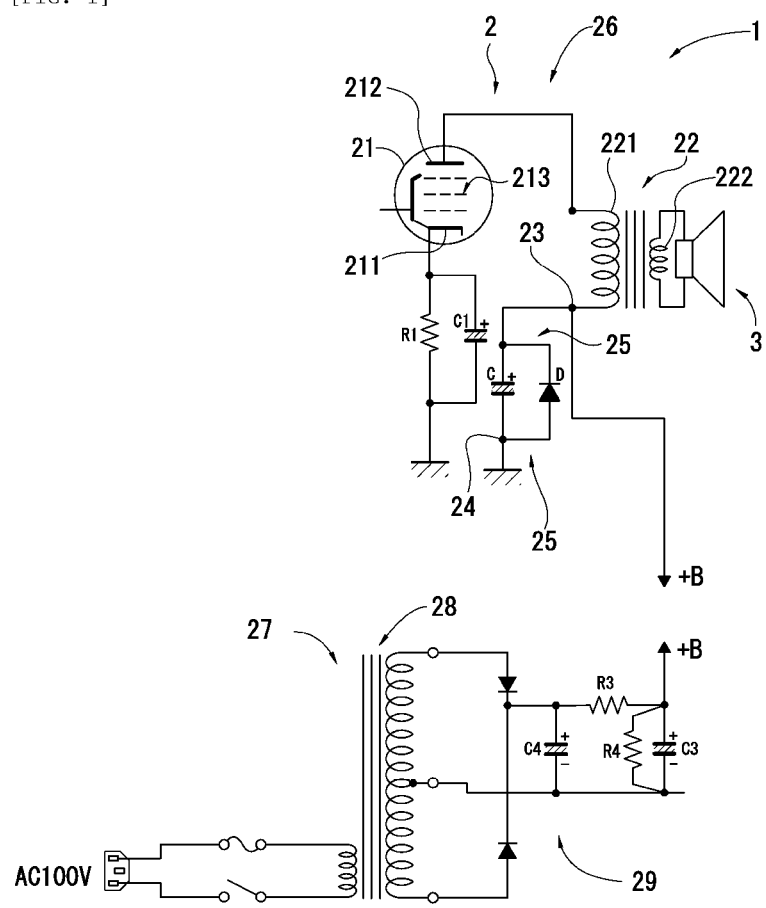

[FIG. 2]
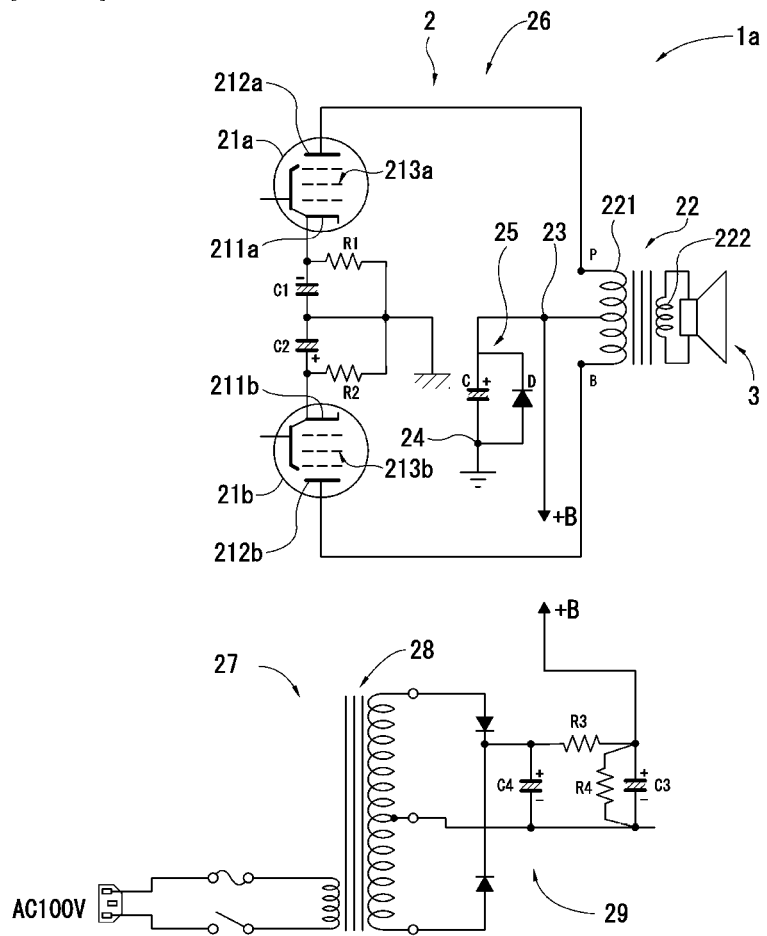

[FIG. 3]
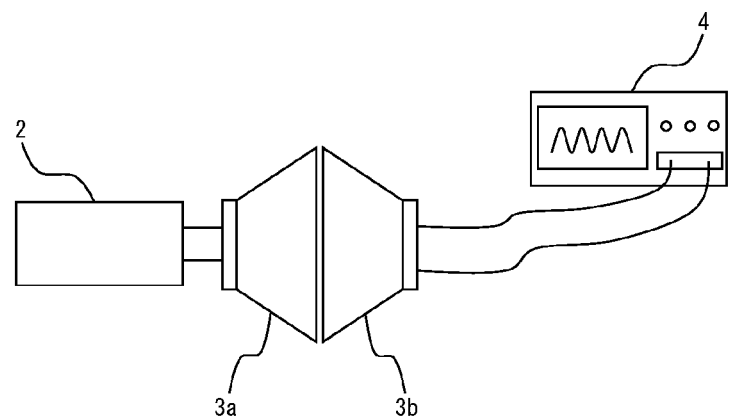

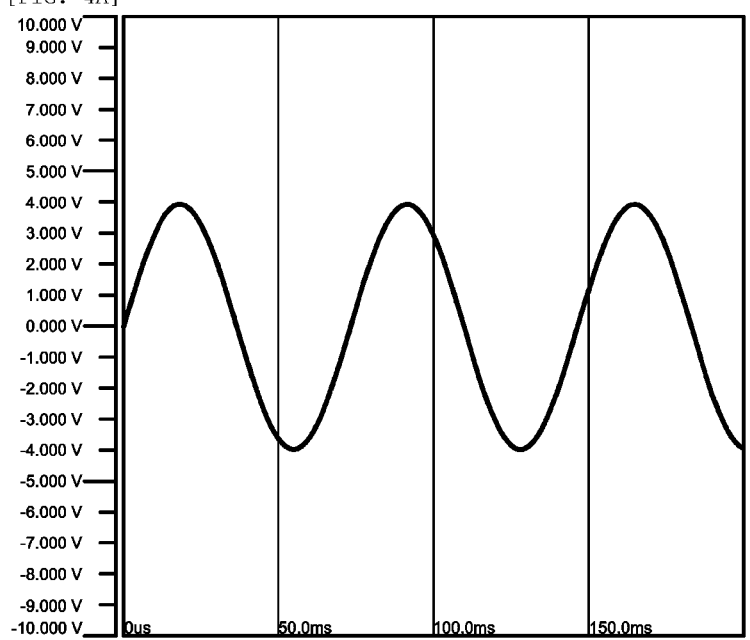
[FIG. 4A]

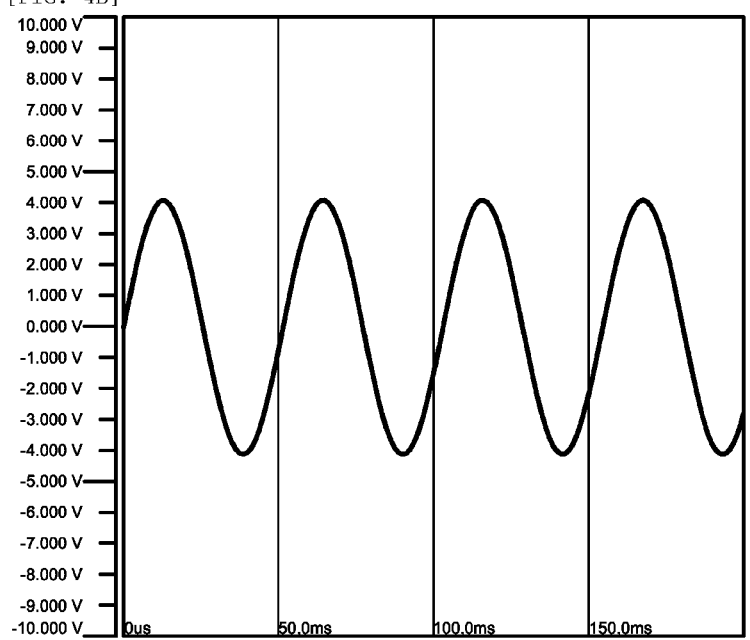
[FIG. 4B]

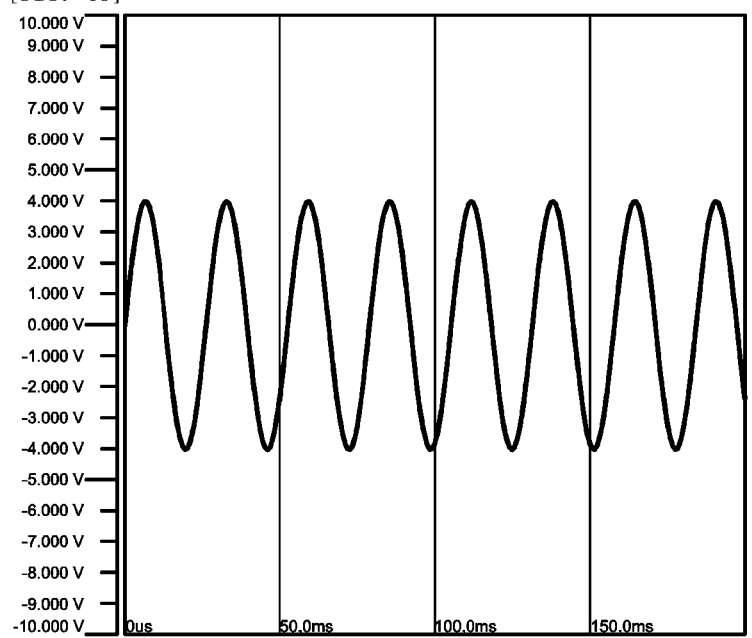

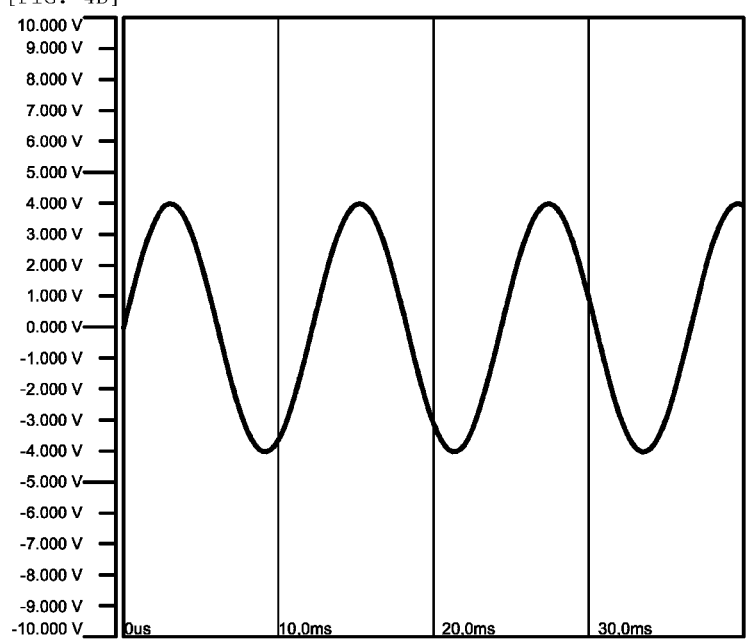
[FIG. 4D]

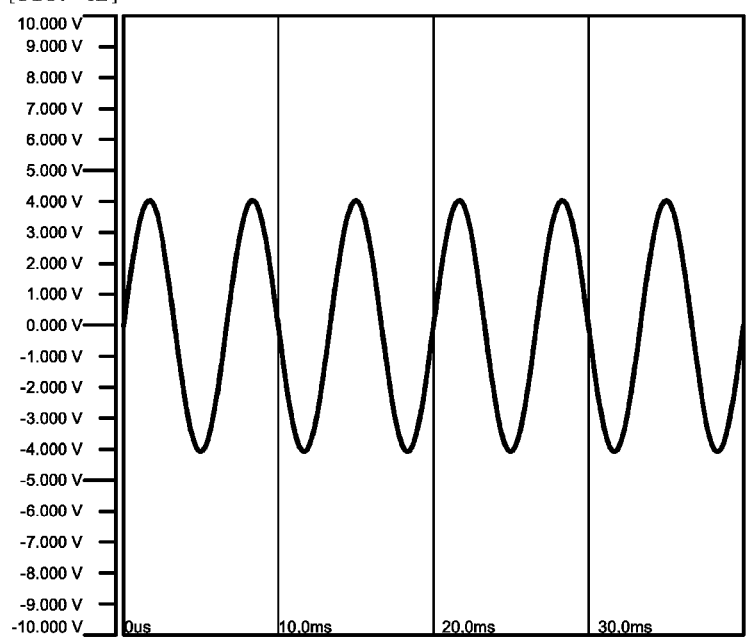

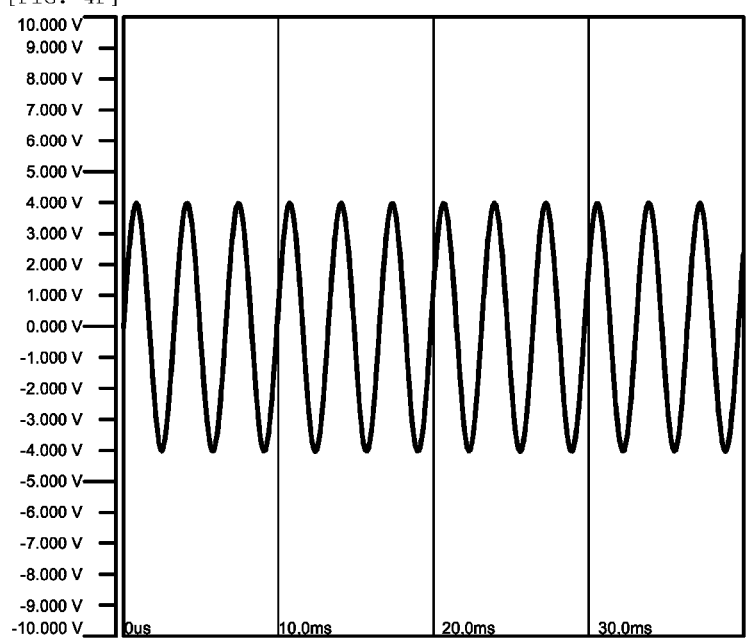
[FIG. 4F]

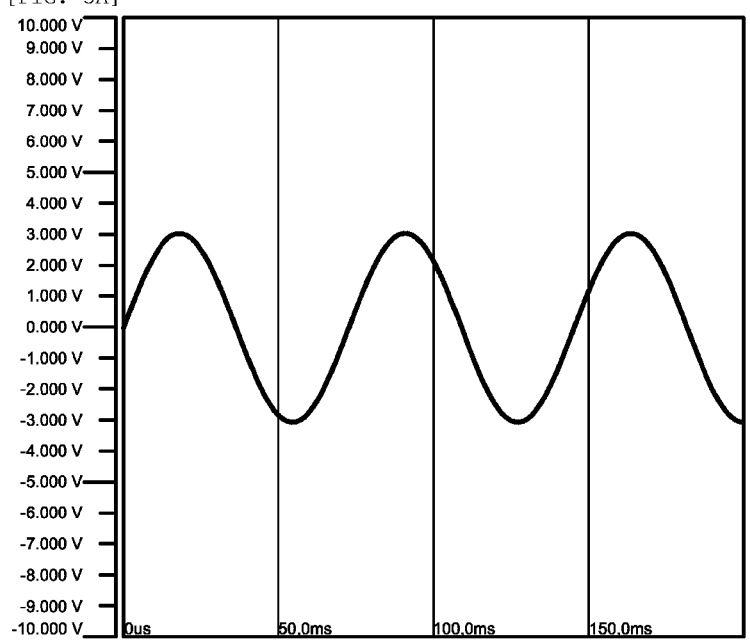

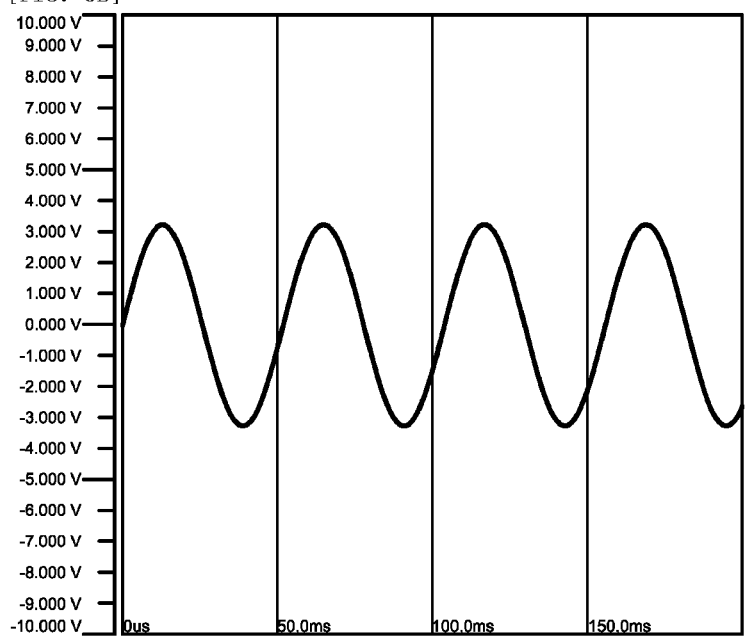

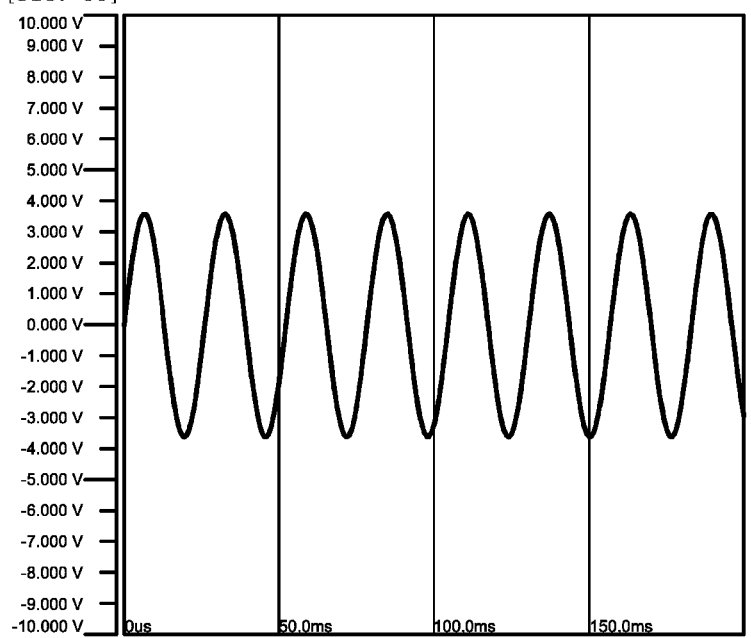
[FIG. 5C]

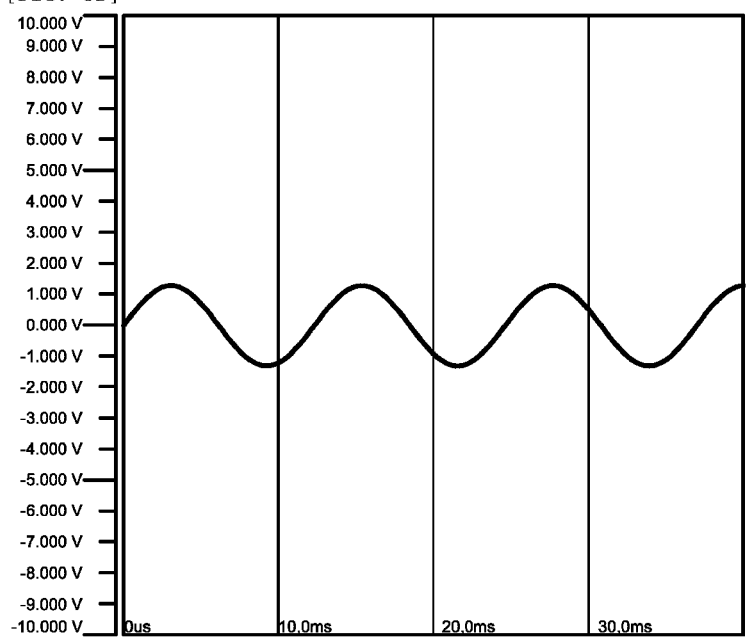
[FIG. 5D]

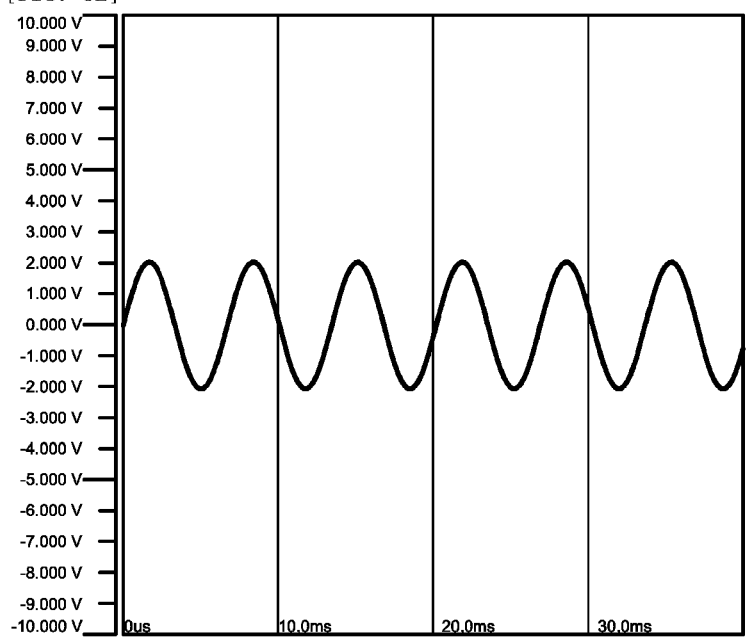

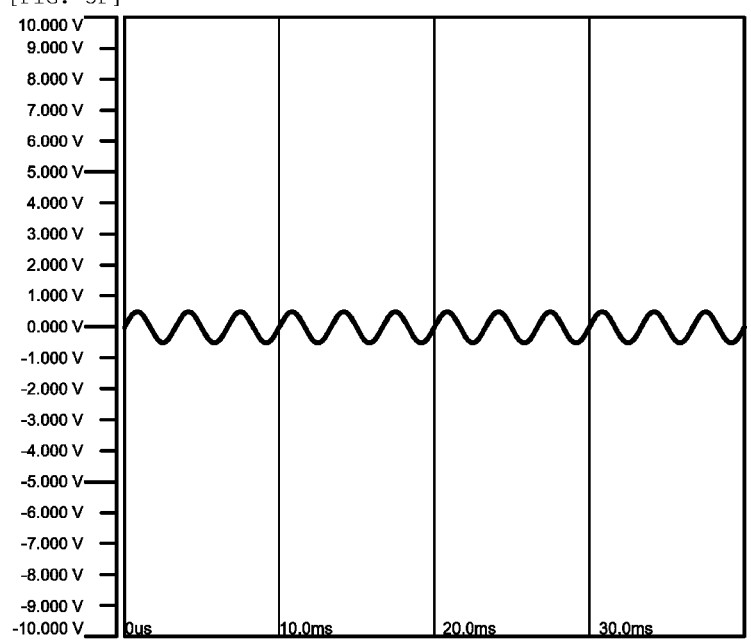

[FIG. 6]
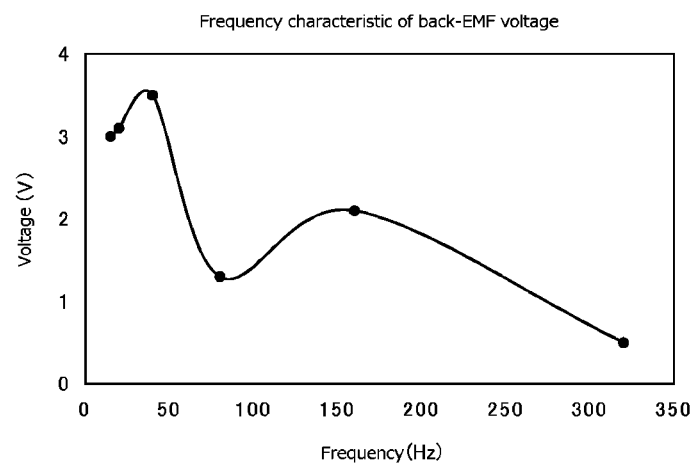

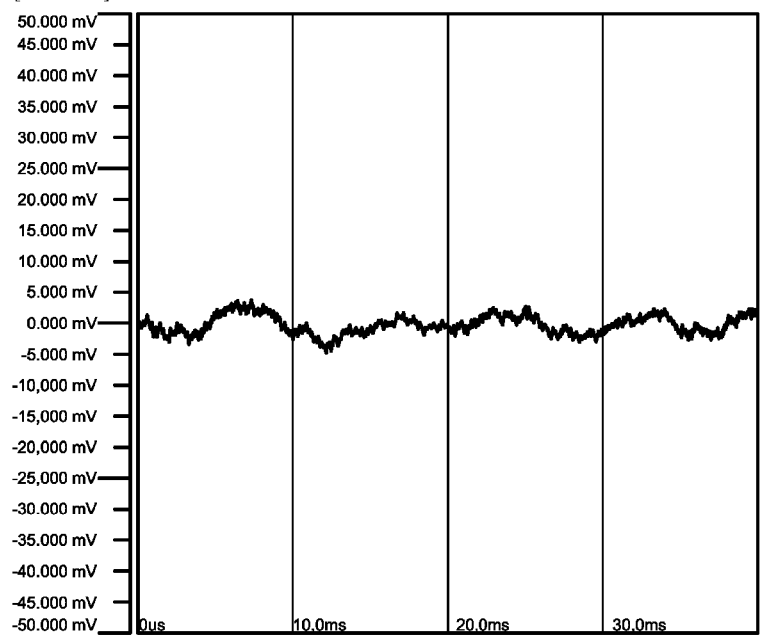
[FIG. 7]

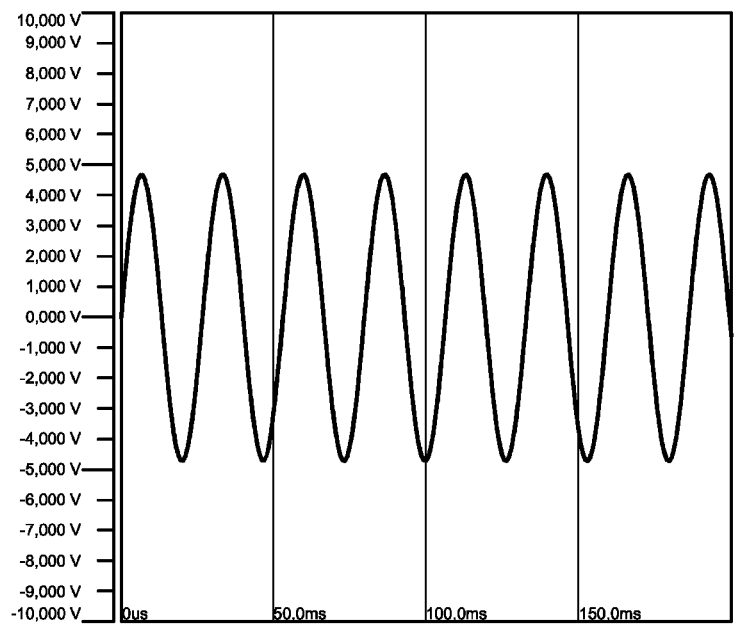
[FIG. 8]

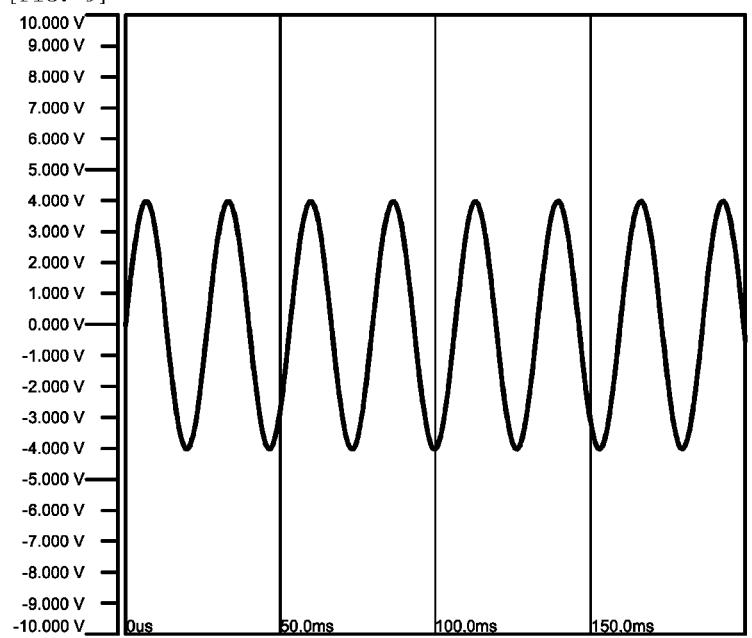
[FIG. 9]

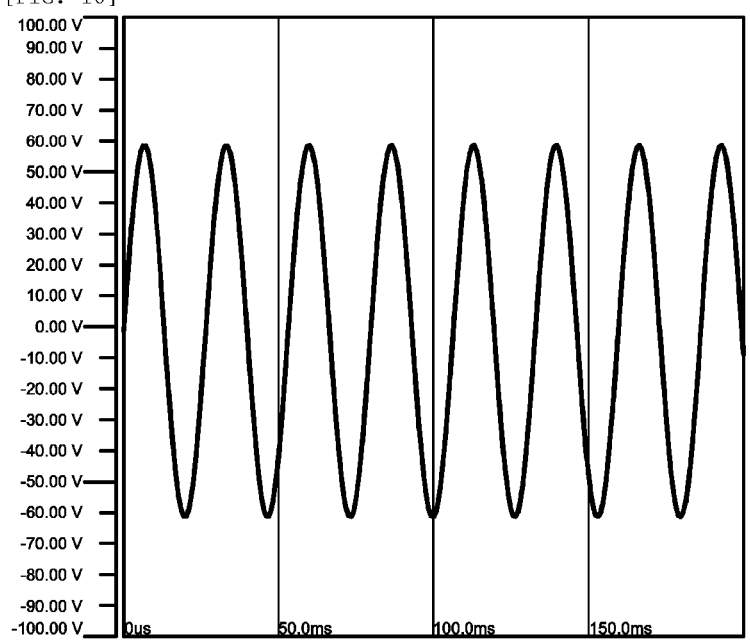
[FIG. 10]

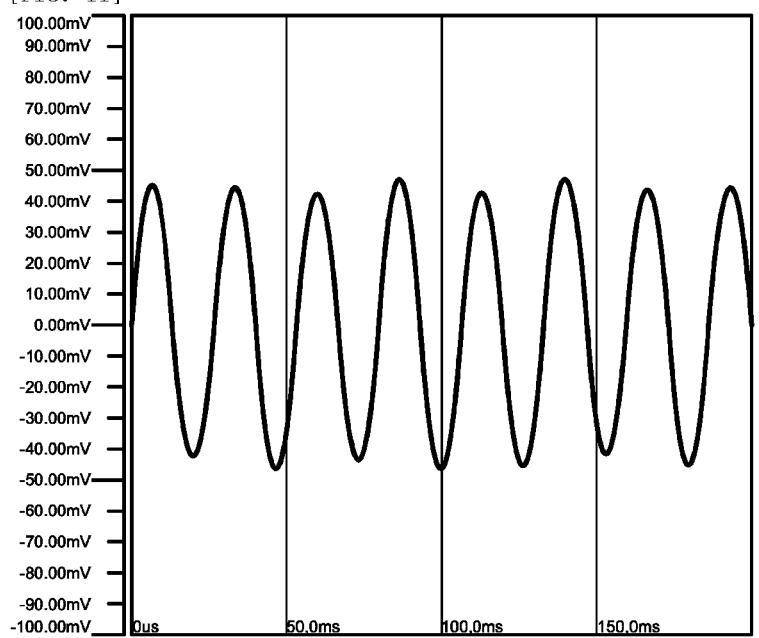
[FIG. 11]

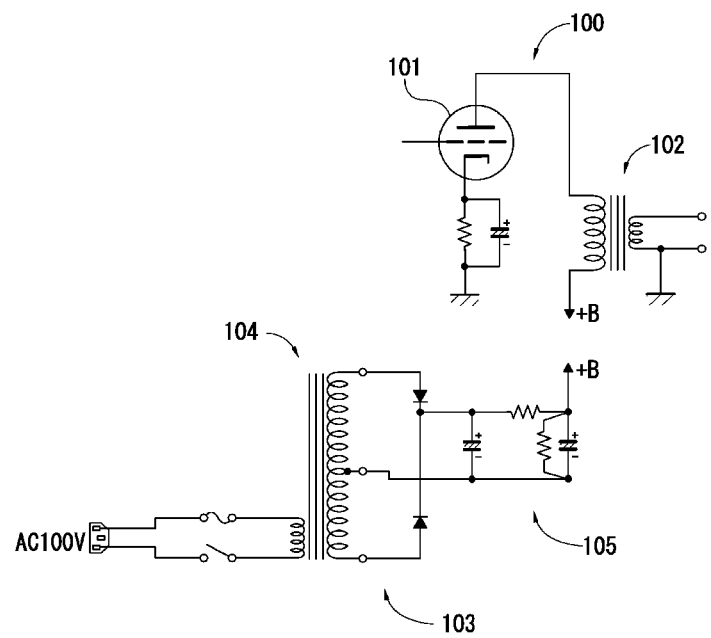
[FIG. 12]

AMPLIFIER DEVICE, AUDIO DEVICE, AND METHOD FOR CONTROLLING AMPLIFIER DEVICE

TECHNICAL FIELD

The present invention relates to an amplifier device, an audio device, and a method for controlling an amplifier device. More specifically, the present invention relates to an amplifier device, an audio device, and a method for controlling an amplifier device, which can suppress the generation of a back-EMF voltage and improve sound quality.

BACKGROUND ART

Audio devices are widely used in home audio equipment, in-vehicle audio equipment, etc., and also widely adopted in personal computers and mobile terminals such as cell phones. In recent years, high-resolution sound sources containing sound information in frequency bands outside an audible range which cannot be heard by human ears have attracted attention, and speaker devices adaptable to these high-resolution sound sources have also been actively developed.

Among the audio devices, amplifier devices (amplifiers) have conventionally undergone various improvements in circuit configuration, circuit elements, materials of components used, etc., in order to improve faithful reproduction sound quality. In recent years, with the development of digital technology, transistors and integrated circuits (IC) have been widely adopted as amplifying elements used in the amplifier devices. On the other hand, even in such a situation where the digital technology has been developed, amplifier devices using vacuum tubes as the amplifying elements (hereinafter, referred to as "vacuum tube amplifiers") are favored by many music lovers because they provide reproduction sound quality excellent in audibility, so that the production thereof is still continued worldwide.

FIG. 12 shows a part of a circuit configuration diagram of a general vacuum tube amplifier disclosed in Patent Literature 1. An output circuit 100 of an amplifier device is mainly composed of a vacuum tube amplifier 101 as an amplifying element for amplifying a voice signal output from a reproduction device (a CD player, a DVD player, etc.), and an output transformer 102 having a primary winding and a secondary winding on the output side of the vacuum tube amplifier 101, and includes a high-pass filter (not shown) and a control device (not shown) for controlling the high-pass filter on the input side of the vacuum tube amplifier 101.

Further, a power supply circuit 103 for supplying power to the vacuum tube amplifier 101 is connected to the output circuit 100. As shown in FIG. 12, the power supply circuit 103 converts a current supplied from an AC 100 V power supply, boosts it by a power supply transformer 104, and smooths it by a smoothing circuit 105, and the resulting DC high voltage (B power supply) is supplied to the primary side of the output transformer 102. In the above configuration, the voice signal amplified by the vacuum tube amplifier 101 is emitted to the outside as a sound wave through a speaker device (not shown) which is a voice output device connected to the secondary side of the output transformer 102.

Incidentally, the speaker device is generally composed of a magnetic circuit including a yoke, a magnet, a plate, a center pole, etc., and a vibrating body including a voice coil, a diaphragm, a frame, etc. Based on an input signal from an amplifier connected to the speaker device, the voice coil vibrates in the axial direction due to a change in current flowing through the voice coil in a magnetic field generated by the magnet, and further, the diaphragm connected to the voice coil vibrates, thereby emitting a sound wave to the outside.

When a voice signal is input to the voice coil, the coil vibrates in the magnetic field to vibrate the diaphragm. At that time, the voice coil vibrates in the magnetic field at the same time (Fleming's right-hand rule and left-hand rule occur at the same time), which generates power. The voltage (current) generated by the power generation is generally called a back-EMF voltage (back-EMF current). The back-EMF voltage has a characteristic of flowing back from the speaker device toward the amplifier, and is input from the secondary side to the primary side of the output transformer, passes between the B terminal and the ground, further passes through the secondary side of the power supply transformer, and is input to the primary side of the power supply transformer in proportion to the transformer winding ratio on the primary side of the transformer core. The back-EMF voltage then overlaps the waveform of the current flowing through the voice coil, thereby muddying the voice signal, resulting in largely affecting the sound quality of the speaker device.

The back-EMF voltage is generated in direct proportion to the strength of the magnetic field in the space of the voice coil and the speed at which the voice coil vibrates, and is input to the ground as an AC signal, causing a large potential distortion in the ground. Accordingly, the idea of the basic circuit design of 0 V by the ground, which has conventionally been the basis in the amplifier design, does not actually achieve 0 V, and the potential of the ground always fluctuates due to the back-EMF voltage, which hinders the faithful reproduction of the voice signal.

More specifically, the back-EMF voltage always causes a voltage displacement (appearing between the positive of the B power supply and 0 V as an AC waveform) at the ground point where 0 V is designed in the output circuit 100 of FIG. 12. Therefore, an accurate voice signal (signal voltage) cannot be output, which is a factor affecting the sound quality from the speaker device.

Furthermore, the back-EMF voltage input into the output circuit 100 in FIG. 12 is also input into the power supply circuit 103. The back-EMF voltage input into the power supply circuit 103 passes through the smoothing circuit 105, is attenuated to a predetermined value in the power supply transformer 104, and is input into the AC 100 V power supply (note that the attenuation width differs depending on the number of turns of coils on the primary side and the secondary side of the power supply transformer). The back-EMF voltage input into the AC 100 V power supply is boosted by the power supply transformer 104, and then passes through the smoothing circuit 105, and is again input into the output circuit 100. When a plurality of amplifier devices are connected to the AC 100 V power supply, the back-EMF voltage input into one amplifier device will be input into the other amplifier device via the AC 100 V power supply, which will affect not only the output signal from the one amplifier device but also the output signal of the other amplifier device.

In order to reduce such back-EMF voltage that causes the deterioration of the sound quality of the speaker device, for example, Patent Literature 2 discloses an audio device in which the back-EMF voltage is corrected to improve the sound quality by providing a feedback circuit for positively feeding back or negatively feeding back a signal corresponding to the back-EMF voltage to a speaker circuit.

Specifically, when the back-EMF voltage is positively fed back, the back-EMF voltage is corrected so as to be increased with respect to the input signal (add a force of pushing or pulling the diaphragm of the speaker device), whereby the movement of the diaphragm becomes smoother than the case where there is no positive feedback. On the other hand, when the back-EMF voltage is negatively fed back, the back-EMF voltage is corrected so as to be decreased with respect to the input signal (suppress the movement of the diaphragm of the speaker device), whereby the diaphragm is less likely to move than the case where there is no negative feedback. In this way, by optionally setting feedback conditions and correcting the back-EMF voltage, the distortion of the sound quality caused by the back-EMF voltage can be prevented.

CITATION LIST

Patent Literature

Patent Literature 1: Japanese Unexamined Patent Application Publication No. 2003-163548
Patent Literature 2: Japanese Unexamined Patent Application Publication No. H10-224884

SUMMARY OF THE INVENTION

Technical Problems

However, in the technique described in Patent Literature 2, a back-EMF voltage generated from a voice coil is detected and a correction value is set according to the voltage, so that a detection circuit for detecting the back-EMF voltage is separately required. Further, Patent Literature 2 only sets the correction value with respect to the detected back-EMF voltage to correct the output voltage output from an amplifier circuit to the speaker circuit, and does not disclose at all the idea of separating the back-EMF voltage from the output voltage output from the amplifying element and suppressing the back-EMF voltage itself.

As described above, even though the existence of the back-EMF voltage is grasped in the conventional art, the idea of suppressing only the back-EMF voltage after separating the output voltage in the amplifier circuit and the back-EMF voltage as an AC voltage, flowing from the speaker device into the amplifier circuit is not disclosed in any literature.

The present invention was made in view of the foregoing point, and an object thereof is to provide an amplifier device, an audio device, and a method for controlling an amplifier device, which can suppress the generation of a back-EMF voltage and improve sound quality.

Solution to the Problems

In order to achieve the foregoing object, an amplifier device of the present invention includes an amplifying element, a transformer having a primary winding for receiving an output signal from the amplifying element and a secondary winding for transmitting, to a load, a voice signal converted from the output signal to a predetermined output level, a power supply terminal connected to a power supply for supplying power to the amplifying element, a constant potential terminal connected to a predetermined constant potential, and a back-EMF voltage suppression circuit interposed between the power supply terminal and the constant potential terminal and provided with a diode and a capacitor arranged in parallel.

Here, the amplifier device includes the amplifying element, so that the voice signal input to the circuit in the amplifier device can be amplified through the amplifying element and be output to the speaker device as a load.

By providing the output transformer having the primary winding for receiving the output signal from the amplifying element and the secondary winding for transmitting, to the load, the voice signal converted from the output signal to the predetermined output level, the voltage of the output signal amplified by the amplifying element can be converted to a predetermined value and be output as the voice signal to the speaker device as the load.

By providing the power supply terminal connected to the power supply for supplying power to the amplifying element, the power supplied from the power supply can be constantly supplied to the amplifying element through the power supply terminal.

By providing the back-EMF voltage suppression circuit provided with the diode and the capacitor arranged in parallel, between the power supply terminal and the constant potential terminal connected to the predetermined constant potential, a back-EMF current due to the back-EMF voltage can be eliminated by short-circuiting only the back-EMF current in the capacitor or the diode.

More specifically, when the back-EMF voltage is a negative potential of the AC at the B terminal, the back-EMF current flows from the ground to the B terminal through the diode, resulting in a short circuit state. On the other hand, when the back-EMF voltage is a positive potential of the AC at the B terminal, the back-EMF current flows to the 0 V of the ground due to the capacitor provided in parallel with the diode, resulting in a short circuit state.

Accordingly, in either case where the back-EMF voltage is the negative potential of the AC or the positive potential of the AC, the back-EMF current is short-circuited. Therefore, the generation of the back-EMF voltage in the voice coil can be prevented. As a result, faithful and noiseless sound waves can be output from the speaker device, so that the sound quality of the speaker device can be improved.

As just described, even if the positive or negative potential is input to the power supply terminal as the back-EMF voltage, the back-EMF current flows through the back-EMF voltage suppression circuit and is short-circuited by the capacitor and the diode. When the back-EMF current is output from the primary side to the secondary side of the output transformer, the back-EMF current is further reduced according to the winding ratio between the primary winding and the secondary winding. Thus, the influence of the back-EMF voltage (back-EMF current) on the output signal output from the amplifier device can be minimized.

In order to achieve the foregoing object, an audio device of the present invention includes a speaker device and an amplifier device having a transformer having a primary winding for receiving an output signal from an amplifying element and a secondary winding for transmitting, to the speaker device, a voice signal converted from the output signal to a predetermined output level, a power supply terminal connected to which a power supply circuit from a power supply for supplying power to the amplifying element, a constant potential terminal having a constant potential that is an absolute value of a voltage input to the power supply terminal by a predetermined value, and a back-EMF voltage suppression circuit interposed between the power supply terminal and the constant potential terminal and provided with a diode and a capacitor in parallel.

Here, by providing the audio device with the speaker device, an output signal amplified by the amplifying element in the amplifier device is input to the speaker device as a voice signal, and the voice signal input to the speaker device becomes a sound wave and can be emitted toward the outside.

When the back-EMF voltage caused by the movement of the voice coil constituting the speaker device is input into the amplifier device via the transformer, the back-EMF current due to the back-EMF voltage is guided into the back-EMF voltage suppression circuit provided between the power supply terminal and the constant potential terminal.

Accordingly, the influence of the back-EMF voltage on the voice signal output from the circuit in the amplifier device toward the speaker device is suppressed, and an accurate voice signal can be output from the amplifier device toward the speaker device. As a result, faithful and noiseless sound waves can be output from the speaker device, so that the sound quality of the speaker device can be improved.

In order to achieve the foregoing object, a method for controlling an amplifier device of the present invention is a method for controlling an amplifier device having a power supply terminal connected to which a power supply circuit from a power supply for supplying power to an amplifying element, a constant potential terminal having a constant potential that is an absolute value of a voltage input to the power supply terminal by a predetermined value, and a back-EMF voltage suppression circuit connected between the power supply terminal and the constant potential terminal, the method including repeating a step of flowing from the power supply terminal toward the constant potential terminal and a step of flowing from the constant potential terminal toward the power supply terminal a back-EMF current due to a back-EMF voltage generated in a load and input from a secondary winding of a transformer to the power supply terminal via a primary winding when an output signal from the amplifying element included in the amplifier device is input to the primary winding of the transformer and a voice signal obtained by converting the output signal input to the primary winding to a predetermined output level in the secondary winding of the transformer is output to the load, and short-circuiting the back-EMF voltage in the back-EMF voltage suppression circuit.

Here, by repeating the step of flowing from the power supply terminal toward the constant potential terminal and the step of flowing from the constant potential terminal toward the power supply terminal the back-EMF current due to the back-EMF voltage generated in the load and input from the secondary winding of the transformer to the power supply terminal via the primary winding, the back-EMF current due to the back-EMF voltage generated in the load continuously flows through the back-EMF voltage suppression circuit, thereby suppressing the back-EMF voltage.

More specifically, in either case where the back-EMF voltage is the negative potential of the AC or the positive potential of the AC, the back-EMF current is short-circuited. Therefore, the generation of the back-EMF voltage in the voice coil can be prevented. From the above, the voice signal for driving the speaker is not affected by the back-EMF current at all, so that faithful and noiseless sound waves can be output from the speaker device and the sound quality of the speaker device can be improved.

Further, by including the step of flowing the back-EMF current from the power supply terminal to the constant potential terminal through the capacitor when the back-EMF voltage applied to the power supply terminal is the positive potential, the back-EMF current flows from the power supply terminal toward the constant potential terminal via the capacitor when the input back-EMF voltage is the positive potential. At this time, the capacitor blocks the DC and allows only the AC to flow, so that, of the currents flowing through the circuit of the amplifier device, only the back-EMF current as an AC current, flows toward the constant potential terminal. Accordingly, a high current can be prevented from flowing from the power supply terminal toward the constant potential terminal, and the entire circuit of the amplifier device can be prevented from being short-circuited.

Further, by including the step of flowing the back-EMF current from the constant potential terminal toward the power supply terminal through the diode when the back-EMF voltage applied to the power supply terminal is the negative potential, the back-EMF current flows from the constant potential terminal which has a potential relatively higher than the power supply terminal toward the power supply terminal, and at this time, the back-EMF current is short-circuited by the diode and the back-EMF voltage is suppressed.

As described above, by taking out only the back-EMF voltage as an AC voltage, from among the voltages flowing through the amplifier circuit and causing the back-EMF current due to the back-EMF voltage to flow into the back-EMF voltage suppression circuit to short-circuit the back-EMF current, the influence of the back-EMF voltage of the output voltage output from the amplifying element can be minimized to prevent distortion or the like of the voice signal output from the load.

Advantageous Effects of the Invention

The amplifier device, the audio device, and the method for controlling the amplifier device according to the present invention can suppress the generation of the back-EMF voltage and improve the sound quality.

BRIEF DESCRIPTION OF DRAWINGS

FIG. 1 is a schematic diagram of an audio device according to a first embodiment of the present invention.

FIG. 2 is a schematic diagram of an audio device according to a second embodiment of the present invention.

FIG. 3 is a schematic diagram showing a state in which a back-EMF voltage is measured using a measuring instrument.

FIG. 4A is a diagram showing a waveform of an input voltage to a speaker device 3a in Measurement 1 (4 V-15 Hz).

FIG. 4B is a diagram showing a waveform of an input voltage to the speaker device 3a in Measurement 1 (4 V-20 Hz).

FIG. 4C is a diagram showing a waveform of an input voltage to the speaker device 3a in Measurement 1 (4 V-40 Hz).

FIG. 4D is a diagram showing a waveform of an input voltage to the speaker device 3a in Measurement 1 (4 V-80 Hz).

FIG. 4E is a diagram showing a waveform of an input voltage to the speaker device 3a in Measurement 1 (4 V-160 Hz).

FIG. 4F is a diagram showing a waveform of an input voltage to the speaker device 3a in Measurement 1 (4 V-320 Hz).

FIG. 5A is a diagram showing a waveform of an output voltage from a speaker device 3b in a comparative example in Measurement 1 (15 Hz).

FIG. 5B is a diagram showing a waveform of an output voltage from the speaker device 3b in the comparative example in Measurement 1 (20 Hz).

FIG. 5C is a diagram showing a waveform of an output voltage from the speaker device 3b in the comparative example in Measurement 1 (40 Hz).

FIG. 5D is a diagram showing a waveform of an output voltage from the speaker device 3b in the comparative example in Measurement 1 (80 Hz).

FIG. 5E is a diagram showing a waveform of an output voltage from the speaker device 3b in the comparative example in Measurement 1 (160 Hz).

FIG. 5F is a diagram showing a waveform of an output voltage from the speaker device 3b in the comparative example in Measurement 1 (320 Hz).

FIG. 6 is a graph showing the relationship between frequency and back-EMF voltage.

FIG. 7 is a diagram showing a waveform of an output voltage from the speaker device 3b in the example at 4 V-40 Hz.

FIG. 8 is a diagram showing a waveform of an input voltage to the speaker device 3b in Measurement 2.

FIG. 9 is a diagram showing a waveform of an output voltage generated in the speaker device 3a in Measurement 2.

FIG. 10 is a diagram showing a waveform of a back-EMF voltage measured by an amplifier device in a comparative example in Measurement 2.

FIG. 11 is a diagram showing a waveform of a back-EMF voltage measured by the amplifier device in an example in Measurement 2.

FIG. 12 is a diagram showing a conventional art.

DESCRIPTION OF EMBODIMENTS

Hereinafter, embodiments of the present invention will be described with reference to the drawings to provide an understanding of the present invention.

First Embodiment

First, an outline of an audio device 1 according to a first embodiment to which the present invention is applied is shown in FIG. 1. The audio device 1 is mainly composed of an amplifier device 2 and a speaker device 3, and is a so-called single amplifier having one vacuum tube amplifier 21 as an amplifying element in the amplifier device.

The amplifier device 2 is composed of the above-mentioned vacuum tube amplifier 21 as the amplifying element, an output transformer 22 connected to an output side (plate) of the vacuum tube amplifier 21 via an output circuit 26, and a power supply circuit 27 for supplying power to the vacuum tube amplifier 21.

The vacuum tube amplifier 21 has the same configuration as that of a known pentode composed of a cathode 211, a plate 212, and three grids 213. Specifically, one end of a parallel circuit of a resistor R1 and a capacitor C1 is connected to the cathode 211, and the other end of the parallel circuit is grounded. Three grids of a control grid as the first grid, a screen grid as the second grid, and a suppressor grid as the third grid, are provided, and the three grids realize a stable amplification operation of the pentode.

Here, the vacuum tube amplifier 21 does not necessarily need to be a pentode and may be composed of a triode. The output transformer 22 has the primary side wound with a primary winding 221 and the secondary side wound with a secondary winding 222. By changing the winding ratio between the primary winding 221 and the secondary winding 222 (the winding ratio between the primary side and the secondary side is set to 15:1 in the embodiment of the present invention, but should not be limited thereto), the output voltage output to the secondary side can be changed.

The primary winding 221 of the output transformer 22 has one end connected to an output circuit 26 from the vacuum tube amplifier 21, and the secondary winding 222 of the output transformer 22 is connected to the speaker device 3. When the output voltage output from the vacuum tube amplifier 21 is transmitted from the primary winding 221 to the secondary winding 222 of the output transformer 22, the output voltage is transformed according to the winding ratio described above, and the transformed output voltage is input to the speaker device 3 as a voice signal.

The primary winding 221 of the output transformer 22 has the other end connected to a power supply terminal 23. The power supply terminal 23 is connected to a power supply circuit 27 for supplying power to the plate 212 of the vacuum tube amplifier 21. The power supply circuit 27 converts a current supplied from an AC 100 V power supply, boosts it by a power supply transformer 28, and smooths it by a smoothing circuit 29, and the resulting DC high voltage (B power supply) is supplied to the plate 212 of the vacuum tube amplifier 21 via the primary side of the output transformer 22.

The secondary side of the output transformer 22 is connected to the speaker device 3. The speaker device 3 is a known dynamic speaker of an external magnet type mainly composed of a frame, a plate, a yoke, a magnet, a diaphragm, and a voice coil.

In the speaker device 3, when the voice signal from the amplifier device 2 is input to the voice coil, a driving force (Lorentz force) acts on the voice coil based on Fleming's left-hand rule, the diaphragm is vibrated in an axial direction of the speaker device, and a sound wave is emitted. At this time, a back-EMF voltage attempting to vibrate the diaphragm of the speaker in the opposite direction is generated in the voice coil.

The back-EMF voltage is output from the speaker device 3, from the secondary side to the primary side of the output transformer 22, and at this time, the back-EMF voltage is affected by the winding ratio between the primary winding 221 and the secondary winding 222. More specifically, in the embodiment of the present invention, the winding ratio between the primary side and the secondary side is set to 15:1, so that the back-EMF voltage generated in the speaker device 3 is input into the output circuit 26 of the amplifier device 2 while being boosted to a magnitude of 15 times the secondary side on the primary side when boosted output from the secondary side to the primary side of the output transformer 22.

The back-EMF voltage overlaps the output signal from the vacuum tube amplifier 21 to cause distortion in the signal waveform as described above and also always causes a voltage displacement at the ground point which is designed to be 0 V in the output circuit 26. As a result, this becomes a factor that causes noise in the sound wave output from the speaker device 3. Further, the back-EMF voltage is input from the output circuit 26 to the power supply circuit 27, attenuated to a predetermined value by the power supply transformer 28, and input to the AC 100 V power supply. Therefore, when a plurality of amplifier devices are connected using a common AC 100 V power supply, the back-EMF voltage is also input to the other amplifier devices via the AC 100 V power supply, which affects the output signal.

Thus, in the present invention, only the back-EMF voltage input from the speaker device 3 into the amplifier device 2 is taken out, and the back-EMF current due to the taken back-EMF voltage to be directed to flow through the back-EMF voltage shorting circuit 25 connected between the terminals having different potential differences to be short-circuited, thereby suppressing the back-EMF voltage and reducing the distortion of the voice signal output from the vacuum tube amplifier 21.

The back-EMF voltage shorting circuit 25 is connected between the power supply terminal 23 and the grounded 0 V reference constant potential terminal 24, and has a circuit configuration in which a capacitor C and a diode D are provided in parallel. The capacitor C is placed so that its positive terminal is on the power supply terminal 23 side and its negative terminal is on the constant potential terminal 24 side, and the diode D is placed so that its cathode terminal is on the power supply terminal 23 side and its anode terminal is on the constant potential terminal 24 side.

Here, the constant potential terminal 24 does not necessarily need to be grounded. The constant potential terminal 24 only has to have a constant potential that is the absolute value of the potential of the power supply terminal 23 by a predetermined value.

When the positive terminal of the capacitor C is placed so as to be on the constant potential terminal 24 side and the negative terminal on the power supply terminal 23 side and the cathode terminal of the diode D is placed so as to be on the constant potential terminal 24 side and the anode terminal on the power supply terminal 23 side, not only the back-EMF current but also a large current including a DC current flowing through the circuit of the amplifier device 2 instantaneously flow from the power supply terminal 23 toward the constant potential terminal 24, and the circuit in the amplifier device 2 may be short-circuited. Thus, from the viewpoint of circuit protection of the amplifier device 2, for the direction from the power supply terminal 23 to the constant potential terminal 24, it is necessary to configure such that only the back-EMF current flows via the capacitor C that does not allow the DC current to pass.

Next, the function in the back-EMF voltage shorting circuit 25 will be described. As described above, the back-EMF voltage is an AC voltage, so that positive and negative potentials are alternately applied to the power supply terminal 23. First, when a positive potential is applied to the power supply terminal 23, the potential of the power supply terminal 23 becomes relatively higher than that of the constant potential terminal 24, which is the 0 V reference. Therefore, the back-EMF current due to the back-EMF voltage flows from the power supply terminal 23 toward the constant potential terminal 24.

At this time, the back-EMF current can be short-circuited by passing through the capacitor C. As described above, the capacitor C allows only the AC to flow, so that, for example, a DC output from the vacuum tube amplifier 21 is blocked. Therefore, the back-EMF current can be short-circuited while preventing a large current from flowing through the back-EMF voltage shorting circuit 25.

On the other hand, when a negative potential is applied to the power supply terminal 23, the potential of the power supply terminal 23 becomes relatively lower than that of the constant potential terminal 24, which is the 0 V reference. Therefore, the back-EMF current due to the back-EMF voltage flows from the constant potential terminal 24 toward the power supply terminal 23. At this time, the back-EMF current is short-circuited when passing through the diode D, so that the back-EMF voltage is suppressed.

As described above, the back-EMF current due to the back-EMF voltage input into the amplifier device 2 is separated from the output voltage output from the vacuum tube amplifier 21, flows through the back-EMF voltage shorting circuit 25 formed between the power supply terminal 23 and the constant potential terminal 24, and then can be short-circuited. The back-EMF voltage whose voltage value is suppressed is further reduced by the output transformer 22 according to the winding ratio of the output transformer 22 even if it is output to the secondary side. Thus, almost no back-EMF voltage is input to the speaker device 3, so that the distortion of the sound quality emitted from the speaker device 3 can be suppressed.

Second Embodiment

Next, an audio device 1a according to a second embodiment of the present invention will be described using FIG. 2. In the following description, components common to those of the first embodiment are denoted by the same reference signs in the drawings, and overlapping description will be omitted.

The audio device 1a according to the second embodiment is a push-pull amplifier composed of a pair of vacuum tube amplifiers 21a, 21b. In this case, a primary winding 221 of an output transformer 22 has one end side connected to an output circuit of the vacuum tube amplifier 21a and the other end side connected to an output circuit of the vacuum tube amplifier 21b.

A power supply terminal 23 connected to a power supply circuit from a B power supply is provided to a center tap drawn out from the middle point of the primary winding 221 of the output transformer 22, and a back-EMF voltage shorting circuit 25 is connected between the power supply terminal 23 and a grounded constant potential terminal with the same configuration as in the first embodiment.

Also in the audio device 1a according to the second embodiment, the back-EMF voltage output from the speaker device 3 is input into the circuit of the amplifier device 2 after being boosted by the output transformer 22 in the same manner as the first embodiment. At this time, however, the back-EMF current due to the back-EMF voltage can be short-circuited by a capacitor C and a diode D in the back-EMF voltage shorting circuit 25.

Next, in order to confirm the suppression effect of the back-EMF voltage by the back-EMF voltage shorting circuit 25 according to the present invention, test results obtained by measuring the back-EMF voltage when the back-EMF voltage shorting circuit 25 is provided in the circuit of the amplifier device 2 (Example) and when it is not provided (Comparative Example) are shown. A speaker device used for the measurement, measurement conditions, etc., are as follows. Although the push-pull amplifier according to the second embodiment described above is used as the amplifier device, the same results are obtained with a single amplifier.

<Specifications of Speaker Device>

Manufacturer name: GOTO UNIT
Model: SG-38 W
Method: 38 cm cone-type woofer unit
Reproduction frequency band: 30 to 600 Hz
Lowest resonance frequency: 27 Hz
Output sound pressure level: 110 dB
Music power: 35 W <Measurement Instrument>
  Manufacturer name: HIOKI E.E. Corporation
  Model: HIOKI8860
<Measurement Location>
  Mechanics and Electronics Research Institute, Fukuoka Industrial Technology Center (3-6-1 Norimatsu, Yahatanishi-ku, Kitakyushu City, Fukuoka Pref.)
<Measurement Date>
  Measurement 1: Feb. 19, 2021
  Measurement 2: Apr. 8, 2021
<Measurement 1>

As shown in FIG. 3, a measurement method of Measurement 1 was such that two identical speaker devices 3a, 3b, were prepared, superimposed so that their diaphragms faced each other, connected at edge portions of frames with bolts and nuts, and then an amplifier device 2 was connected to an input/output terminal of one speaker device 3a, and a measurement instrument 4 was connected to an input/output terminal of the other speaker device 3b. The winding ratio between the primary side and the secondary side of the output transformer of the amplifier device 2 was set to 15:1.

When an output signal from the amplifier device 2 is input to the speaker device 3a to actuate the speaker device 3a under the foregoing conditions, a sound wave emitted from the speaker device 3a is input to the speaker device 3b through the air. A voltage generated by the vibration of the speaker device 3b at this time can be regarded as the back-EMF voltage generated from the speaker device 3a.

FIG. 4A to FIG. 4F each show a voltage waveform of the voice signal input to the secondary side of the output transformer 22. As shown in FIG. 4A to FIG. 4F, AC voltages of 4 V-15 Hz, 4 V-20 Hz, 4 V-40 Hz, 4 V-80 Hz, 4 V-160 Hz, and 4 V-320 Hz were input to the speaker device 3a in this measurement.

First, waveforms of output voltages measured in the speaker device 3b when the back-EMF voltage shorting circuit 25 according to the embodiment of the present invention is not provided are shown in FIG. 5A to FIG. 5F, and fluctuations of the back-EMF voltage for each frequency are shown in FIG. 6. In general, as the back-EMF voltage, a voltage of the same level as a voltage (4V) input to the speaker device 3a is generated on the secondary side of the output transformer 22, boosted according to the winding ratio of the output transformer 22, and then input to the amplifier device 2. As is clear from FIG. 6, there is a characteristic that the back-EMF voltage is highest in a frequency band of around 40 Hz, and gradually decreases as the frequency increases.

When the back-EMF voltage is input to the amplifier device 2, it is input to the secondary side of the output transformer 22 and output from the primary side. At this time, the back-EMF voltage is boosted according to the winding ratio (15:1) of the output transformer 22. For example, in the case of an input voltage having a frequency of 40 Hz shown in FIG. 5C, it can be estimated that the back-EMF voltage (about 3.5 to 3.8 V) generated in the speaker device 3a is boosted about 15 times (around 60 V) by the output transformer 22 and input to the amplifier device 2.

On the other hand, when the back-EMF voltage is output from the amplifier device 2 to the speaker device 3a, it is input to the primary side of the output transformer 22 and output from the secondary side. At this time, the back-EMF voltage is attenuated to about one fifteenth according to the winding ratio of the output transformer 22. More specifically, as shown in FIG. 5C, in the case of the frequency of 40 Hz, it can be seen that the back-EMF voltage of about 60 V estimated to be generated on the primary side is attenuated to around 4 V, which is about one fifteenth, and input to the speaker device 3a.

Next, a waveform of an output voltage measured in the speaker device 3b when the back-EMF voltage shorting circuit 25 according to the embodiment of the present invention is provided in the amplifier device 2 is shown in FIG. 7. FIG. 7 shows measurement results at 40 Hz, which is a frequency band where the back-EMF voltage is highest.

By providing the back-EMF voltage shorting circuit 25, the back-EMF voltage generated in the speaker device 3a is short-circuited in the back-EMF voltage shorting circuit 25. As a result, when the back-EMF voltage is output from the amplifier device 2 to the speaker device 3a, it is attenuated to about one fifteenth by the output transformer 22 to be within about 3 mV (that is, the back-EMF voltage of about 3.0 to 4.5 mV is assumed to be generated in the amplifier device 2), and it can be confirmed that the back-EMF voltage is suppressed to about one thousandth of Comparative Example.

<Measurement 2>

In Measurement 2, the voltage in the amplifier circuit 2 was directly measured in order to confirm how much voltage the back-EMF voltage generated from the speaker device becomes in the amplifier device 2 and is input into the amplifier circuit. As preconditions for the measurement, two identical speaker devices 3a, 3b were prepared, superimposed so that their diaphragms faced each other, and joined at edge portions of frames with bolts and nuts in the same manner as in FIG. 3, and in this state, an input voltage was input to the speaker device 3b, and a voltage measured in the amplifier device 2 at this time was measured by the measurement instrument. The voltage measurement point in the amplifier device 2 is the voltage between P and B in the circuit diagram of FIG. 2.

The input voltage input to the speaker device 3b is shown in FIG. 8 and the voltage measured in the speaker device 3a at this time is shown in FIG. 9. In Measurement 2, the voltage to be input to the speaker device 3b was adjusted so that a voltage (that is, back-EMF voltage) measured in the speaker device 3a became 4 V. The frequency band used for the measurement was 40 Hz. Voltage waveforms measured in the amplifier device 2 when the voltage was input to the speaker device 3b under the foregoing conditions are shown in FIG. 10 and FIG. 11. FIG. 10 is a voltage waveform when the back-EMF voltage shorting circuit 25 according to the present invention was not provided, and FIG. 11 is a voltage waveform when the back-EMF voltage shorting circuit 25 according to the present invention was provided.

First, as shown in FIG. 10, a voltage of about 60 V is generated between P and B in the amplifier device 2 (in the measurement result of FIG. 10, the central position of the graph is slightly shifted to the upper side for convenience of the output method). This matches the estimated value in Measurement 1 that the back-EMF voltage of 4 V generated in the speaker device 3a is boosted to about 15 times according to the winding ratio between the primary side and the secondary side of the output transformer 22, and as a result, the voltage of about 60 V is input into the amplifier device 2.

When the back-EMF voltage shorting circuit 25 is provided, as shown in FIG. 11, the back-EMF voltage measured between P and B in the amplifier device 2 is suppressed to about 45 mV. The back-EMF voltage in the amplifier device 2 is then attenuated to about one fifteenth according to the winding ratio of the output transformer 22 when being input to the speaker device 3a. That is, the back-EMF voltage of about 45 mV generated on the primary side of the output transformer 22 is attenuated to about 3.0 to 4.5 mV, which is one fifteenth, and is input to the speaker device 3a. It can be seen that this result also matches the measurement result of Measurement 1.

Also from the above measurement results, it can be said that it is clear that the back-EMF voltage shorting circuit 25 according to the present invention efficiently suppresses the back-EMF voltage and contributes to improving the quality of the sound emitted from the speaker device 3.

As described above, the amplifier device, the audio device, and the method for controlling the amplifier device to which the present invention is applied can suppress the generation of the back-EMF voltage and improve the sound quality.

REFERENCE SIGNS LIST 1, 1a Audio device
2 Amplifier device
21, 21a, 21b Vacuum tube amplifier
211, 211a, 211b Cathode
212, 212a, 212b Plate
213, 213a, 213b Grid
22 Output transformer
221 Primary winding
222 Secondary winding
23 Power supply terminal
24 Constant potential terminal
25 Back-EMF voltage suppression circuit
26 Output circuit
27 Power supply circuit
28 Power supply transformer
29 Smoothing circuit
3, 3a, 3b Speaker device
4 Measurement instrument
C, C1, C2, C3, C4 Capacitor
D Diode
R, R1, R2, R3, R4 Resistor

The invention claimed is:

1. An amplifier device comprising:
an amplifying element;
a transformer having a primary winding for receiving an output signal from the amplifying element and a secondary winding for transmitting to a load a voice signal converted from the output signal to a predetermined output level;
a power supply terminal connected to a power supply for supplying power to the amplifying element;
a constant potential terminal connected to a predetermined constant potential; and
a back-EMF voltage suppression circuit interposed between the power supply terminal and the constant potential terminal and provided with a diode and a capacitor arranged in parallel.

2. The amplifier device according to claim 1, wherein the constant potential terminal has a potential that is lower than an absolute value of a voltage input to the power supply terminal by a predetermined value,
wherein the diode has a cathode terminal connected to the power supply terminal and an anode terminal connected to the constant potential terminal, and
wherein the capacitor has a positive terminal connected to the power supply terminal and a negative terminal connected to the constant potential terminal.

3. The amplifier device according to claim 1, wherein the constant potential at the constant potential terminal is a ground potential.

4. An audio device comprising:
a speaker;
an amplifier device including
a transformer having a primary winding for receiving an output signal from an amplifying element and a secondary winding for transmitting to the speaker a voice signal converted from the output signal to a predetermined output level,
a power supply terminal connected to a power supply circuit from a power supply for supplying power to the amplifying element,
a constant potential terminal having a constant potential that is lower than an absolute value of a voltage input to the power supply terminal by a predetermined value, and
a back-EMF voltage suppression circuit interposed between the power supply terminal and the constant potential terminal and provided with a diode and a capacitor arranged in parallel.

5. A method for controlling an amplifier device having a power supply terminal connected to a power supply circuit from a power supply for supplying power to an amplifying element of the amplifier device, a constant potential terminal having a constant potential that is lower than an absolute value of a voltage input to the power supply terminal by a predetermined value, and a back-EMF voltage suppression circuit, the method comprising the steps of:
allowing a back-EMF current prompted by a back-EMF voltage to flow from the power supply terminal toward the constant potential terminal and vice versa, wherein the back-EMF voltage is generated in a load and transmitted from a secondary winding of a transformer to the power supply terminal via a primary winding of the transformer when an output signal from the amplifying element of the amplifier device is transmitted to the primary winding of the transformer and a voice signal converted from the output signal transmitted to the primary winding to a predetermined output level in the secondary winding of the transformer which is transmitted to the load, and
suppressing the back-EMF voltage using the back-EMF voltage suppression circuit, wherein the back-EMF voltage suppression circuit is interposed between the power supply terminal and the constant potential terminal.

6. The method for controlling the amplifier device according to claim 5, wherein the back-EMF voltage suppression circuit is provided with a diode and a capacitor arranged in parallel,
wherein the back-EMF voltage suppression is configured for the back-EMF current to be directed to flow from the power supply terminal toward the constant potential terminal through the capacitor when the back-EMF voltage applied to the power supply terminal is a positive potential, and
wherein the back-EMF voltage suppression is configured for the back-EMF current to flow from the constant potential terminal toward the power supply terminal through the diode when the back-EMF voltage applied to the power supply terminal is a negative potential.

* * * * *